(12) United States Patent
Li et al.

(10) Patent No.: US 11,107,713 B2
(45) Date of Patent: Aug. 31, 2021

(54) CONVEYING SYSTEM AND METHOD FOR OPERATING THE SAME

(71) Applicant: TAIWAN SEMICONDUCTOR MANUFACTURING COMPANY LTD., Hsinchu (TW)

(72) Inventors: Fu-Hsien Li, Taichung (TW); Chi-Feng Tung, Miaoli County (TW); Hsiang Yin Shen, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 124 days.

(21) Appl. No.: 16/425,305

(22) Filed: May 29, 2019

(65) Prior Publication Data
US 2020/0381277 A1 Dec. 3, 2020

(51) Int. Cl.
| | |
|---|---|
| *H01L 21/67* | (2006.01) |
| *G05B 19/418* | (2006.01) |
| *H01L 21/677* | (2006.01) |
| *B66C 13/18* | (2006.01) |
| *B65G 49/07* | (2006.01) |
| *B66C 7/08* | (2006.01) |

(52) U.S. Cl.
CPC ........ *H01L 21/67242* (2013.01); *B65G 49/07* (2013.01); *B66C 7/08* (2013.01); *B66C 13/18* (2013.01); *G05B 19/41815* (2013.01); *H01L 21/67727* (2013.01); *G05B 2219/45031* (2013.01); *H01L 21/67005* (2013.01)

(58) Field of Classification Search
CPC ......... H01L 21/67242; H01L 21/67727; H01L 21/67005; B65G 49/07; B66C 13/18; B66C 7/08; G05B 19/41815; G05B 2219/45031
See application file for complete search history.

(56) References Cited

U.S. PATENT DOCUMENTS

| | | | | |
|---|---|---|---|---|
| 3,995,206 | A * | 11/1976 | Aronstein | H01L 21/67276 318/593 |
| 2008/0035449 | A1* | 2/2008 | Lee | H01L 21/67727 198/349 |
| 2010/0194014 | A1* | 8/2010 | Huang | H01L 21/67346 269/287 |
| 2011/0160300 | A1* | 6/2011 | Hammond | A61P 9/12 514/459 |

(Continued)

*Primary Examiner* — Mohammad Ali
*Assistant Examiner* — Sheela Rao
(74) *Attorney, Agent, or Firm* — WPAT, P.C.; Anthony King

(57) ABSTRACT

A method includes providing a rail, a first conveying unit movably mounted on the rail, and a central controller configured to control the first conveying unit; displacing the first conveying unit along the rail at a first speed; obtaining a first vibration measurement upon the displacement of the first conveying unit along the rail at the first speed; analyzing the first vibration measurement; transmitting a first signal based on the analysis of the first vibration measurement to the central controller; providing a second conveying unit movably mounted on the rail; transmitting a first feedback signal based on the first signal from the central controller to the second conveying unit; and displacing the second conveying unit along the rail at a second speed based on the first feedback signal.

15 Claims, 12 Drawing Sheets

(56) References Cited

U.S. PATENT DOCUMENTS

2014/0112741 A1\* 4/2014 Yoshioka .............. H01L 21/677
 414/222.01
2019/0148198 A1\* 5/2019 Hsieh ................ H01L 21/67733
 700/218

\* cited by examiner

CONVEYING SYSTEM AND METHOD FOR OPERATING THE SAME

BACKGROUND

The semiconductor industry has experienced exponential growth, and integrated circuits (ICs) are used in a wide variety of applications. ICs are typically manufactured by automated or semi-automated equipments. Workpieces, such as substrates or wafers, are loaded into the equipment, and then several electrical components and circuitries are fabricated over or within the workpieces through numerous manufacturing operations.

Automated Material Handling Systems (AMHS) have been widely used in semiconductor fabrication to automatically handle and transport groups of the workpieces between various processing equipments. There are numerous types of automated vehicles (such as automatic guided vehicle (AGV), rail guided vehicle (RGV), overhead hoist transport (OHT), etc.) for moving and transporting carriers (such as front opening unified pods (FOUPs)) carrying the workpieces during fabrication. For example, an OHT system automatically moves OHT vehicles carrying the workpieces from a load port of one processing equipment to a load port of another processing equipment.

There is a continuous need to modify the manufacturing operations and improve an efficiency of transport of the workpieces between the processing equipments, such as maximize or increase a throughput rate and output rate of the workpieces.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
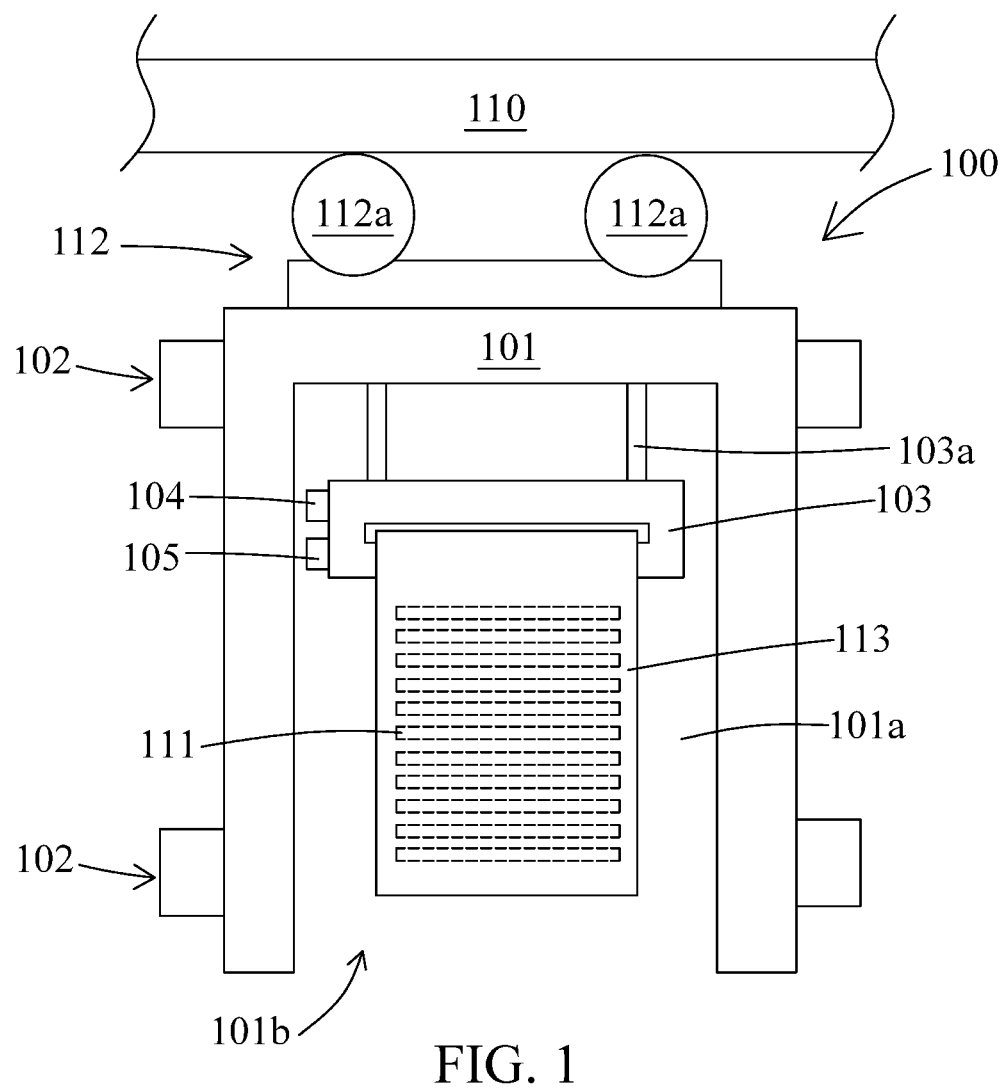
FIG. 1 is a schematic isometric view of a conveying unit in a retracted status in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A conveying system is involved during semiconductor fabrication. The conveying system includes a conveying unit configured to travel along a rail and carry a semiconductor structure from one processing machine to another. The conveying unit may experience vibration during traveling along the rail. For example, the conveying unit may be severely oscillated upon traveling along a section of the rail configured in U shape, or there is a sudden change of traveling direction due to configuration of the rail. Such vibration may cause delamination of components from the semiconductor structure, particles or chippings in the carrier falling on the semiconductor structure, etc. The particles may contaminate or even damage the semiconductor structure. As a result, a reliability of the semiconductor structure may be adversely affected.

In the present disclosure, a method of operating a conveying system is disclosed. The method includes providing a rail, a first conveying unit movably mounted on the rail, and a central controller configured to control the first conveying unit; displacing the first conveying unit along the rail at a first speed; obtaining a first vibration measurement upon the displacement of the first conveying unit along the rail at the first speed; analyzing the first vibration measurement; transmitting a first signal based on the analysis of the first vibration measurement from the first conveying unit to the central controller; providing a second conveying unit movably mounted on the rail; transmitting a first feedback signal based on the first signal from the central controller to the second conveying unit; and displacing the second conveying unit along the rail at a second speed based on the first feedback signal.

The second (succeeding) conveying unit travels along the rail at a speed based on an analysis of vibration experienced by the first (previous) conveying unit upon traveling along the rail. As such, vibration experienced by the second conveying unit upon the traveling along the rail at the speed would be mitigated compared with the vibration of the first conveying unit. Therefore, particles falling on a semiconductor structure carried by the conveying unit upon traveling are minimized. Contamination and damages of the semiconductor structure are reduced or prevented.

Further, another method of operating a conveying system is disclosed. The method includes providing a rail including a first section and a second section, a conveying unit movably mounted on the rail and configured to displace along the first section at a first predetermined speed and along the second section at a second predetermined speed, and a central controller configured to control the conveying unit; deriving a first speed by the central controller based on parameters associated with the conveying unit; displacing the conveying unit along the first section of the rail at the first speed; deriving a second speed by the central controller based on the parameters; and displacing the conveying unit along the second section of the rail at the second speed, wherein the first speed is derived by increasing or decreasing the first predetermined speed, and the second speed is derived by increasing or decreasing the second predetermined speed.

The conveying unit can travel at an adjusted speed instead of the predetermined speed. The adjusted speed is derived based on the parameters associated with the conveying unit (such as total weight of the conveying unit, a lot size of semiconductor structures inside the conveying unit, etc.). As such, different conveying units would have different speed adjustments and thus would travel at different speeds along the same section of the rail. Therefore, the conveying unit can travel along a section of the rail at an optimized speed instead of a fixed predetermined speed, while vibration of the conveying unit traveling along the section of the rail is minimized or less than a predetermined vibration threshold.

Further, a conveying unit is disclosed. The conveying unit is operable by the conveying system, The conveying unit includes a housing; a collision prevention mechanism disposed on a sidewall of the housing; a gripping member configured to hold a carrier for carrying a semiconductor structure; a sensor disposed on the gripping member and configured to measure and collect data associated with vibration of the gripping member; and an unit controller disposed on the gripping member and configured to analyze the data from the sensor and control a movement of the conveying unit. Therefore, the traveling speed of the conveying unit along the rail can be adjusted based on vibration measured by the sensor and analysis result from the unit controller.

FIG. 1 is a schematic view of a conveying unit 100 in accordance with various embodiments of the present disclosure. In some embodiments, the conveying unit 100 includes a housing 101, a collision prevention mechanism 102, a gripping member 103, a sensor 104 and an unit controller 105. In some embodiments, the conveying unit 100 is configured to travel along a rail 110. In some embodiments, the conveying unit 100 is configured to carry and transport a semiconductor structure 111 from a location to another location. In some embodiments, the conveying unit 100 is an overhead hoist transport (OHT) vehicle. In some embodiments, the conveying unit 100 is hung under the rail 110.

In some embodiments, the conveying unit 100 is movably mounted to the rail 110. In some embodiments, the conveying unit 100 is configured to complement and cooperate with the rail 110 for moving laterally or horizontally along the rail 110. In some embodiments, the conveying unit 100 includes a traveling mechanism 112 configured to moveably mount the housing 101 to the rail 110. In some embodiments, the traveling mechanism 112 is installed between the housing 101 and the rail 110. In some embodiments, the traveling mechanism 112 includes a motor (not shown in figures) and a wheel 112a movably engaged with the rail 110. The conveying unit 100 travels laterally upon rotation of the wheel 112a. In some embodiments, the motor is configured to actuate the wheel 112a such that the wheel 112a can be rotated and the conveying unit 100 can travel laterally along the rail 110.

In some embodiments, the housing 101 of the conveying unit 100 is a rigid frame surrounding several components such as the gripping member 103, the sensor 104 and the unit controller 105. In some embodiments, the housing 101 includes a chamber 101a and an opening 101b for accessing the chamber 101a. In some embodiments, the gripping member 103, the sensor 104 and the unit controller 105 are disposed within the chamber 101a and are accessible through the opening 101b.

In some embodiments, the collision prevention mechanism 102 is disposed on a sidewall of the housing 101. In some embodiments, the collision prevention mechanism 102 is configured to prevent collision of the conveying unit 100 with another conveying unit 100 upon traveling and prevent damages on the conveying unit 100. In some embodiments, the collision prevention mechanism 102 can prevent the conveying unit 100 from physical contact with another conveying unit.

In some embodiments, the collision prevention mechanism 102 includes a magnet configured to repel with another magnet disposed on another conveying unit, such that the conveying unit 100 repels another conveying unit when another conveying unit is approaching. In some embodiments, the collision prevention mechanism 102 includes a shock absorbed configured to absorb a force exerted on the conveying unit by another conveying unit upon collision.

In some embodiments, the gripping member 103 is configured to hold a carrier 113 for carrying the semiconductor structure 111. In some embodiments, the gripping member 103 securely holds the carrier 113 to transport the semiconductor structure 111 along the rail 110 from a location to another. In some embodiments, a bar 103a is attached to the gripping member 103 and is extendable to bring the gripping member 103 out of the housing 101 and retractable to bring the gripping member 103 back to the housing 101. In some embodiments, the bar 103a is telescopically extendable and retractable.

In some embodiments, the gripping member 103 is configured to hold and release the carrier 113 such as FOUP, standard mechanical interface (SMIF) pods, etc. In some embodiments, the carrier 113 is configured to hold several semiconductor structures 111. In some embodiments, the semiconductor structure 111 is a substrate, a wafer, a package or the like. In some embodiments, the semiconductor structure 111 includes semiconductive materials such as silicon or other suitable materials. In some embodiments, the semiconductor structure 111 includes circuitries or electrical components disposed thereon. In some embodiments, a lot or a group of semiconductor structures 111 are disposed inside the carrier 113 to isolate from the surroundings and contamination.

In some embodiments, the conveying unit 100 securely holds the carrier 113 inside the housing 101 by extending the bar 103a out of the housing 101, gripping a top portion of the carrier 113 by the gripping member 103, and then retracting the bar 103a to lift up the carrier 113 and the gripping member 103 back to the housing 101. In some embodiments, the conveying unit 100 releases the carrier 113 by extending the bar 103a out of the housing 101, opening the gripping member 103 to release the carrier 113, and then retracting the bar 103a to lift up the gripping member 103 back to the housing 101. In some embodiments, the bar 103a is in a retracted status (as shown in FIG. 1), and the gripping member 103 and the carrier 113 are disposed inside the housing 101 upon movement of the conveying unit 100 along the rail 110.

Figure 2:
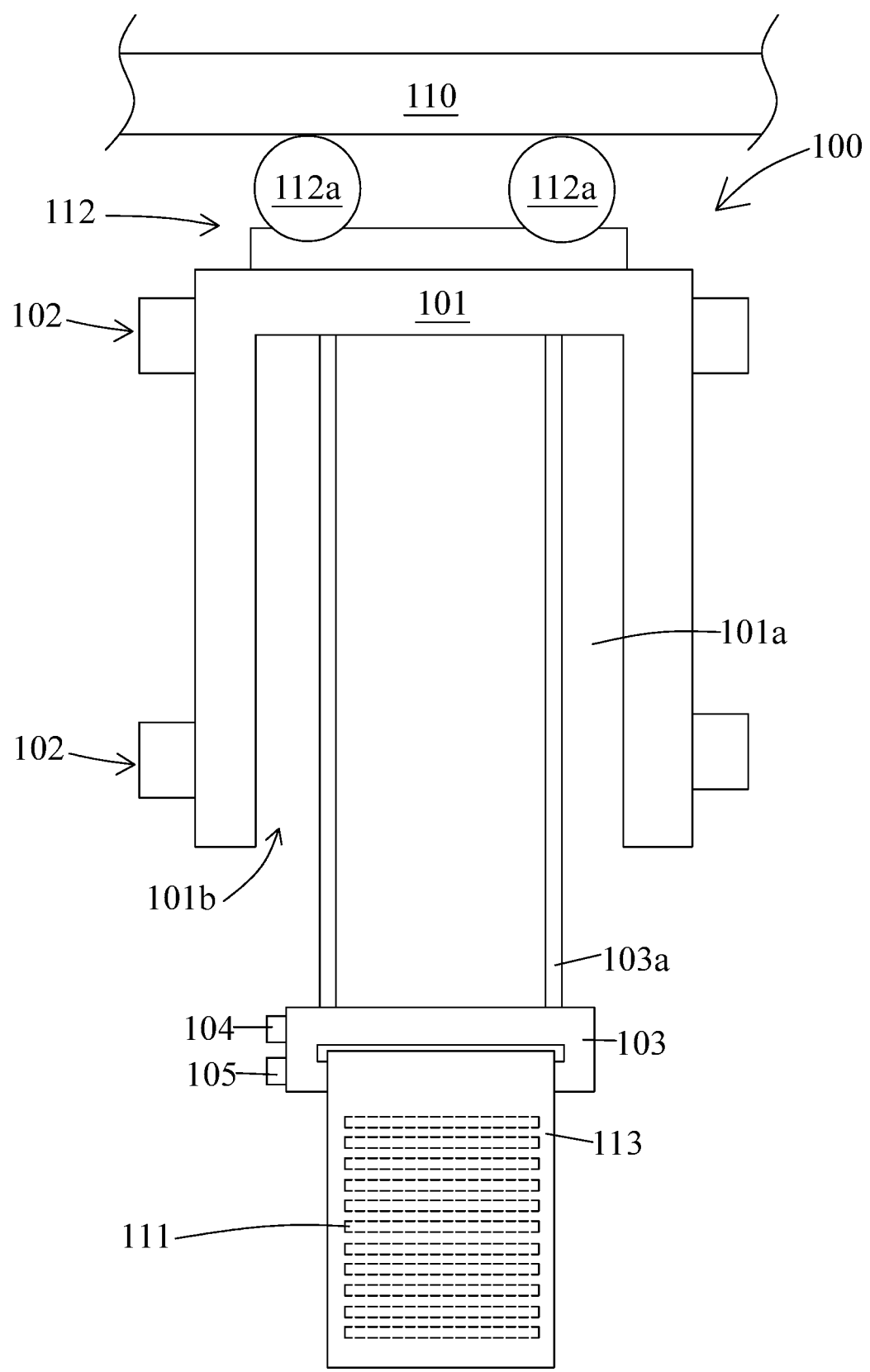
FIG. 2 is a schematic isometric view of a conveying unit in an extended status in accordance with some embodiments of the present disclosure.

In some embodiments, the sensor 104 is disposed on the gripping member 103 and configured to collect data associated with vibration of the gripping member 103. In some embodiments, the sensor 104 is disposed inside the housing 101. In some embodiments, the sensor 104 is disposed inside the housing 101 when the bar 103a is in the retracted status, while the sensor 104 is disposed out of the housing 101 when the bar 103a is in the extended status (as shown in FIG. 2). In some embodiments, the sensor 104 is disposed within the chamber 101a of the housing 101 and inside the housing 101 upon the movement of the conveying unit 100 along the rail 110.

In some embodiments, the sensor 104 is attached to and contacts the gripping member 103. In some embodiments, the sensor 104 is configured to sense and measure the vibration of the gripping member 103 when the conveying unit 100 is traveled along the rail 110. In some embodiments, the vibration measured by the sensor 104 is the vibration of the gripping member 103. Since the sensor 104 is attached to the gripping member 103 close to the carrier 113 and the semiconductor structure 111, the vibration measured by the sensor 104 is substantially the same as the vibration experienced by the carrier 113 or vibration experienced by the semiconductor structure 111 in the carrier 113. In other words, the sensor 104 is configured to measure the vibration of the carrier 113 or the vibration of the semiconductor structure 111. The vibration experienced by the carrier 113 or the semiconductor structure 111 can be accurately measured.

In some embodiments, the sensor 104 measures and records the vibration of the gripping member 103 upon displacement of the conveying unit 100 along the rail 110. In some embodiments, magnitudes and frequencies of the vibration of the gripping member 103 upon displacement of the conveying unit 100 along the rail 110 are recorded for subsequent analysis. In some embodiments, the sensor 104 is a vibration sensor or meter.

In some embodiments, the unit controller 105 is disposed on the gripping member 103. In some embodiments, the unit controller 105 is disposed adjacent to the sensor 104. In some embodiments, the unit controller 105 is configured to analyze the data associated with the vibration of the gripping member 103 from the sensor 104. In some embodiments, the data associated with the vibration of the gripping member 103 is transmitted to the unit controller 105. In some embodiments, the unit controller 105 is wirelessly communicable with the sensor 104. In some embodiments, the unit controller 105 is electrically connected to the sensor 104 by a wire. In some embodiments, the unit controller 105 can analyze the data from the sensor 104 and derive several results, such as a maximum or minimum of the vibration, from the data.

In some embodiments, the unit controller 105 is configured to transmit the results to another controller. In some embodiments, the unit controller 105 is configured to receive a signal from another controller. In some embodiments, the unit controller 105 is configured to control the movement of the conveying unit 100. For example, the movement of the conveying unit 100 can be adjusted when the unit controller 105 receives a signal from another controller. In some embodiments, the unit controller 105 is a microcontroller, microprocessor or machine control unit (MCU) module.

The sensor 104 is installed on the gripping member 103 for sensing and measuring the vibration experienced by the gripping member 103, the carrier 113 or the semiconductor structure 111. As such, a speed of the conveying unit 100 traveling along the rail 110 can be adjusted based on the vibration sensed and measured by the sensor 104. For example, if the vibration is severe and is greater than an acceptable level or a predetermined threshold, the speed of the conveying unit 100 would be decreased or adjusted until the vibration is less than or equal to the predetermined threshold. Therefore, the vibration is minimized or in the acceptable level. As such, particles or contaminates falling on the semiconductor structure 111 from the carrier 113 due to the vibration can be minimized or prevented. As a result, quality of the semiconductor structure 111 would not be adversely affected.

Figure 3:
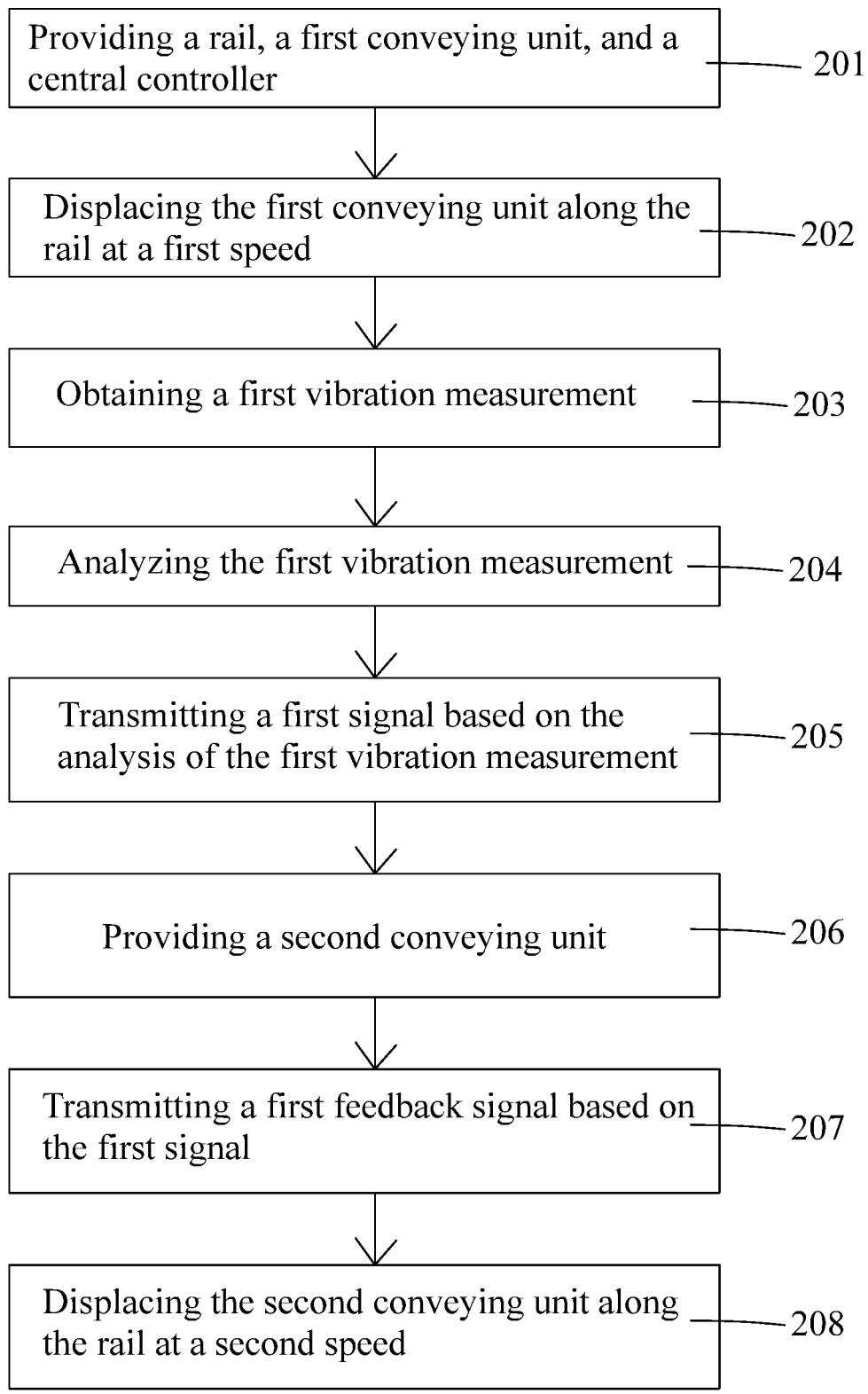
FIG. 3 is a flow diagram of a method of operating a first conveying system in accordance with some embodiments of the present disclosure.

In the present disclosure, a method of operating a conveying system is disclosed. A method 200 includes a number of operations and the description and illustration are not deemed as a limitation as the sequence of the operations. FIG. 3 is an embodiment of the method 200 of operating a first conveying system 300. The method 200 includes a number of operations (201, 202, 203, 204, 205, 206, 207 and 208).

Figure 4:
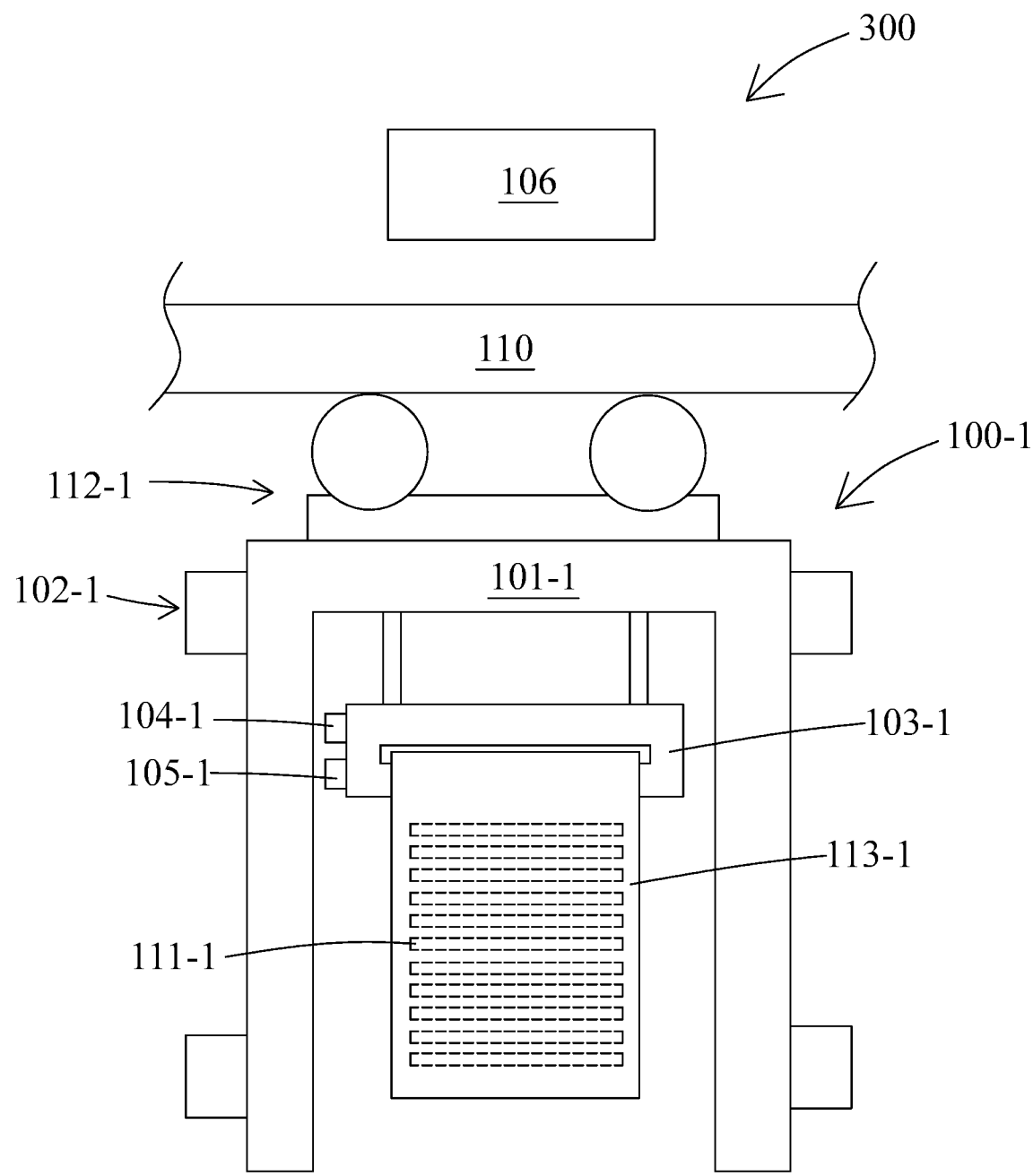
FIGS. 4-5 are schematic views of operating the first conveying system by a method of FIG. 3 in accordance with some embodiments of the present disclosure.

In operation 201, a rail 110, a first conveying unit 100-1 and a central controller 106 are provided as shown in FIG. 4. In some embodiments, the first conveying system 300 includes the rail 110, the first conveying unit 100-1 hung under the rail 110 and the central controller 106. In some embodiments, the rail 110 and the first conveying unit 100-1 are in configurations as described above or shown in FIGS. 1-2. In some embodiments, the first conveying unit 100-1 is movably mounted on the rail 110. In some embodiments, the first conveying unit 100-1 includes a first housing 101-1, a first gripping member 103-1 disposed inside the first housing 101-1, a first sensor 104-1 disposed on the first gripping member 103-1, and a first unit controller 105-1 disposed on the first gripping member 103-1, which are in configurations as described above or shown in FIGS. 1-2.

In some embodiments, the central controller 106 is configured to receive a signal from the first unit controller 105-1 of the first conveying unit 100-1, transmit a feedback signal to the first unit controller 105-1, and control movement of the first conveying unit 100-1. In some embodiments, the central controller 106 is wirelessly communicable with the first unit controller 105-1. In some embodiments, the central controller 106 is an OHT controller.

In operation 202, the first conveying unit 100-1 is displaced along the rail 110 at a first speed. In some embodiments, the first conveying unit 100-1 is moved laterally along the rail 110 at the first speed. In some embodiments, the first speed is a predetermined speed for the first conveying unit 100-1 traveling along the rail 110. In some embodiments, the predetermined speed is derived only based on factors (such as a configuration or shape of the rail 110, etc.) unrelated to parameters associated with the first conveying unit 100-1. In some embodiments, the first speed is derived based on the predetermined speed and factors (such as a weight of the first semiconductor structures 111-1 in the first carrier 113-1, etc.) related to the parameters associated with the first conveying unit 100-1. In some embodiments, a vibration is experienced by the first conveying unit 100-1 upon displacement along the rail 110 at the first speed.

In operation 203, a first vibration measurement is obtained by the first sensor 104-1 upon the displacement of the first conveying unit 100-1 along the rail 110 at the first speed. In some embodiments, the first vibration measurement includes several vibration measurements measured by the first sensor 104-1 during a predetermined duration of the displacement. For example, several vibration measurements are obtained by measuring the vibration of the first conveying unit 100-1 every second upon the displacement of the first conveying unit 100-1 along the rail 110 at the first speed.

In some embodiments, each vibration measurement includes parameters such as magnitude or frequency of the vibration. In some embodiments, the first vibration measurement is vibration experienced by the first gripping member 103-1, the first carrier 113-1 or the first semiconductor structure 111-1. In some embodiments, the first vibration measurement including several vibration measurements is collected and recorded by the first sensor 104-1.

In operation 204, the first vibration measurement is analyzed by the first unit controller 105-1. In some embodiments, the first vibration measurement is transmitted from the first sensor 104-1 to the first unit controller 105-1 for vibration analysis. In some embodiments, the first vibration measurement is wirelessly transmitted from the first sensor 104-1 to the first unit controller 105-1. In some embodiments, the first sensor 104-1 is electrically connected to the first unit controller 105-1 by a wire, and the first vibration measurement is transmitted from the first sensor 104-1 to the first unit controller 105-1 through the wire. In some embodiments, several results (such as a maximum or minimum among the first vibration measurement, a position of the rail where the maximum or minimum vibration occurred, etc.) are derived by the first unit controller 105-1 after the analysis of the first vibration measurement.

In operation 205, a first signal based on the analysis of the first vibration measurement is transmitted from the first unit controller 105-1 to the central controller 106. In some embodiments, the first signal is generated based on the analysis of the first vibration measurement, and then transmitted to the central controller 106. In some embodiments, the first signal is wirelessly transmitted from the first unit controller 105-1 to the central controller 106.

Figure 5:
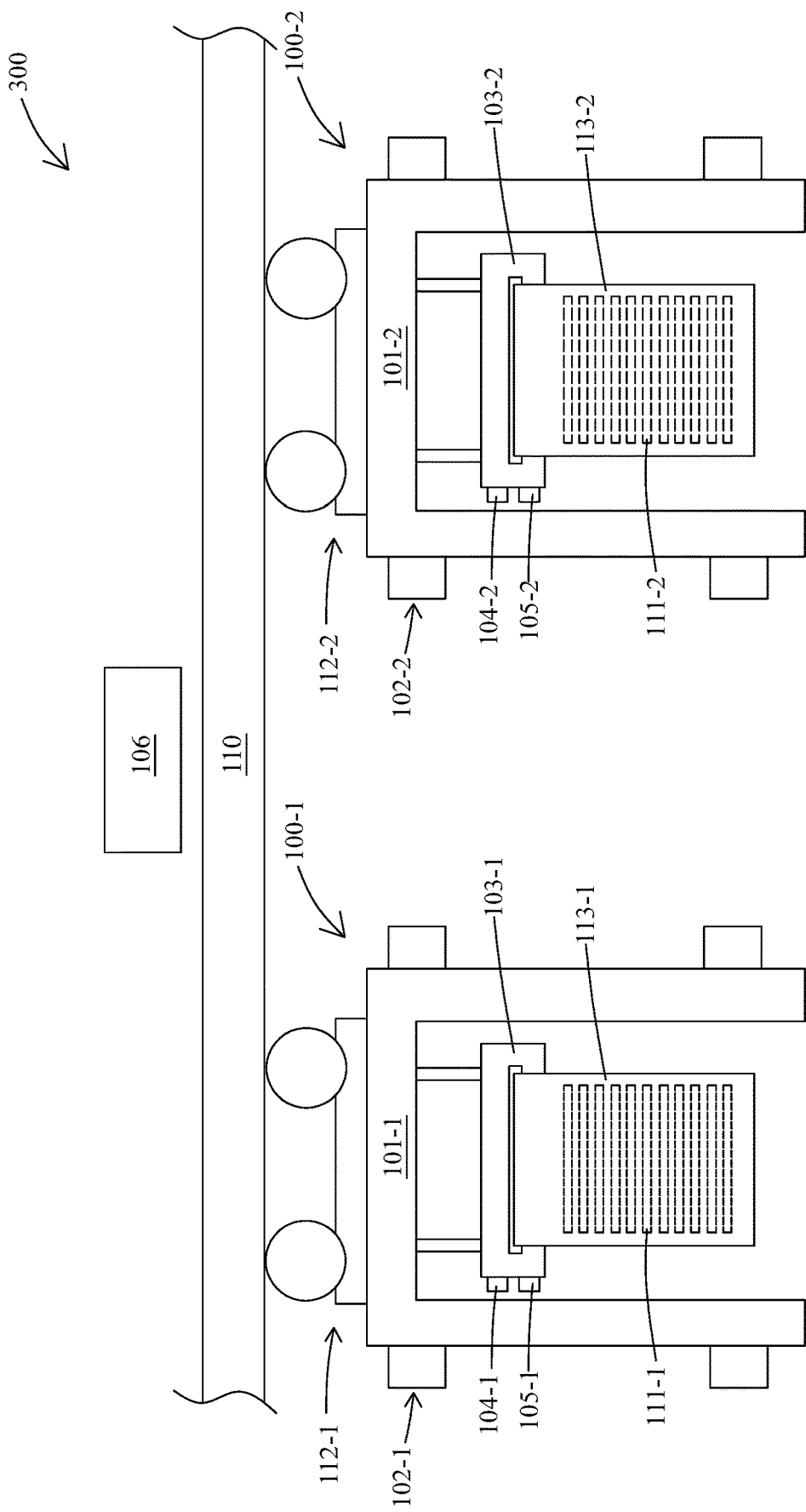

In operation 206, a second conveying unit 100-2 is provided as shown in FIG. 5. In some embodiments, the second conveying unit 100-2 is in configuration similar to the first conveying unit 100-1 described above or shown in FIGS. 1-2. In some embodiments, parameters associated with the first conveying unit 100-1 are different from parameters associated with the second conveying unit 100-2. For example, a weight of the first conveying unit 100-1 is substantially different from a weight of the second conveying unit 100-2, or a lot size of the first semiconductor structures 111-1 is substantially different from a lot size of the second semiconductor structures 111-2.

In some embodiments, the second conveying unit 100-2 is movably mounted on the rail 110. In some embodiments, the second conveying unit 100-2 includes a second housing 101-2, a second gripping member 103-2 disposed inside the second housing 101-2, a second sensor 104-2 disposed on the second gripping member 103-2, and a second unit controller 105-2 disposed on the second gripping member 103-2, which are in configurations similar to the first housing 101-1, the first gripping member 103-1, the first sensor 104-1 and the first unit controller 105-1 respectively described above or shown in FIGS. 1-2.

In operation 207, a first feedback signal based on the first signal is transmitted from the central controller 106 to the second unit controller 105-2. In some embodiments, the first feedback signal is generated based on the first signal from the first sensor 104-1, and then transmitted to the second unit controller 105-2 of the second conveying unit 100-2. In some embodiments, the first feedback signal is wirelessly transmitted from the central controller 106 to the second unit controller 105-2.

In some embodiments, the first signal is analyzed by the central controller 106, and then the first feedback signal is generated by the central controller 106 after the analysis. In some embodiments, the parameters associated with the second conveying unit 100-2 (such as a weight of the second semiconductor structures 111-2 in the second carrier 113-2, etc.) and a predetermined speed for the second conveying unit 100-2 traveling along the rail 110 are considered upon the analysis by the central controller 106.

In operation 208, the second conveying unit 100-2 is displaced along the rail 110 at a second speed based on the first feedback signal. In some embodiments, the second conveying unit 100-2 is moved laterally along the rail 110 at the second speed. In some embodiments, the second speed is derived based on the analysis of the first vibration measurement and the parameters associated with the second conveying unit 100-2, etc. In some embodiments, the second speed is derived by adjusting a predetermined speed for the second conveying unit 100-2 traveling along the rail 110 based on the analysis of the first vibration measurement and the parameters associated with the second conveying unit 100-2.

In some embodiments, the first speed is substantially different from the second speed. In other words, the first conveying unit 100-1 and the second conveying unit 100-2 may travel at different speed along the same rail 110.

In some embodiments, the second speed is substantially less than the first speed if the first vibration measurement is substantially greater than a predetermined vibration threshold. For example, if the vibration experienced by the first conveying unit 100-1 is substantially greater than the predetermined vibration threshold, the second speed is derived by decreasing the first speed or decreasing the predetermined speed for the second conveying unit 100-2 traveling along the rail 110. In other words, the second conveying unit 100-2 is decelerated compared with the displacement of the first conveying unit 100-1.

In some embodiments, the second speed is substantially greater than the first speed if the first vibration measurement is substantially less than a predetermined vibration threshold. For example, if the vibration experienced by the first conveying unit 100-1 is substantially less than the predetermined vibration threshold, the second speed is derived by increasing the first speed or increasing the predetermined speed for the second conveying unit 100-2 traveling along the rail 110. In other words, the second conveying unit 100-2 is accelerated compared with the displacement of the first conveying unit 100-1.

Figure 6:
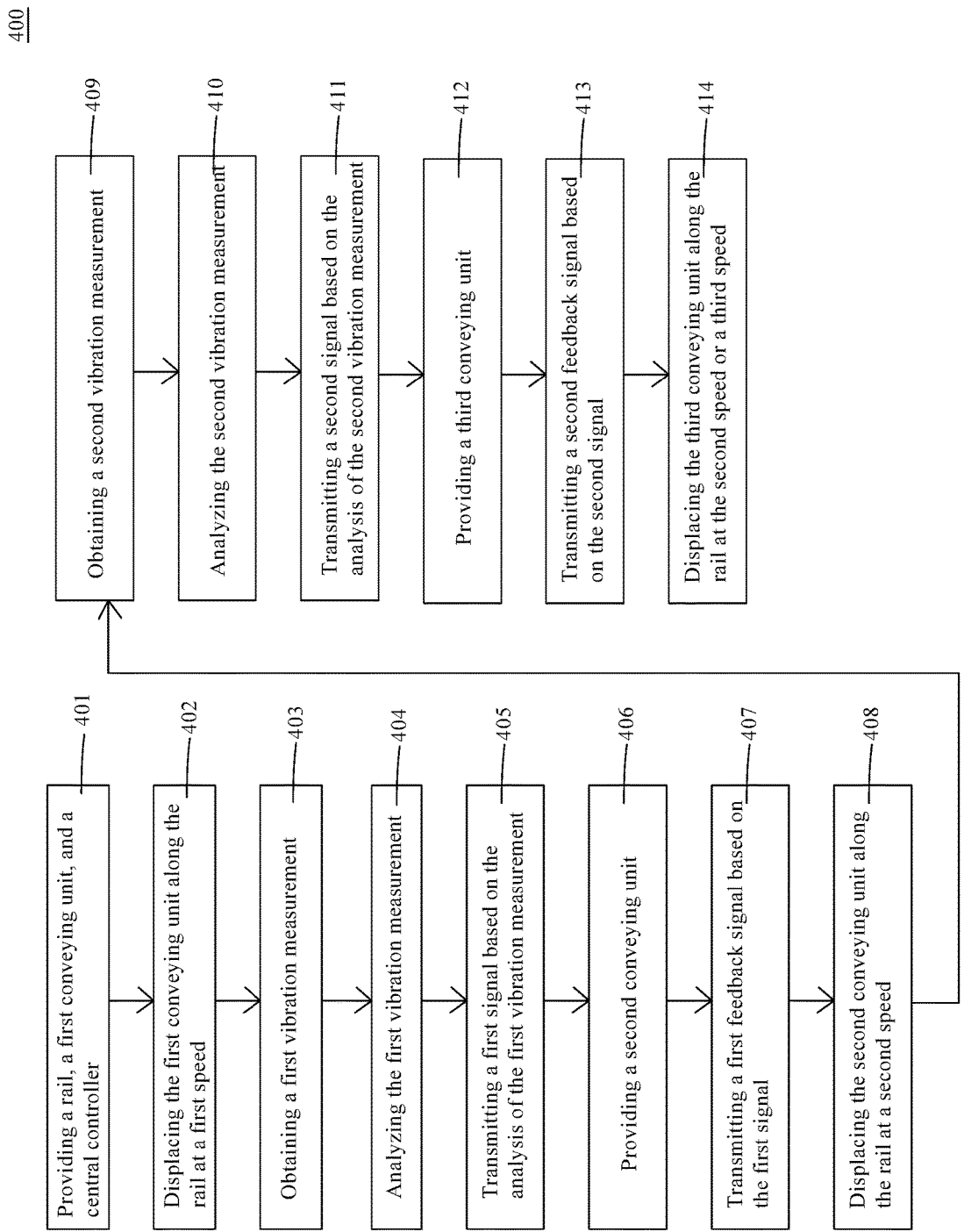
FIG. 6 is a flow diagram of a method of operating a second conveying system in accordance with some embodiments of the present disclosure.

In the present disclosure, another method of operating a conveying system is disclosed. A method 400 includes a number of operations and the description and illustration are not deemed as a limitation as the sequence of the operations. FIG. 6 is an embodiment of the method 400 of operating a second conveying system 500. The method 400 includes a number of operations (401, 402, 403, 404, 405, 406, 407, 408, 409, 410, 411, 412, 413 and 414). The operations 401-408 are implemented in a way same as the operations 201-208 respectively, and therefore are not described again.

In operation 409, a second vibration measurement is obtained by the second sensor 104-2 of the second conveying unit 100-2 upon the displacement of the second conveying unit 100-2 along the rail 110 at the second speed. In some embodiments, the second vibration measurement includes several vibration measurements measured by the second sensor 104-2 during a predetermined duration of the displacement. For example, several vibration measurements are obtained by measuring the vibration of the second conveying unit 100-2 every second upon the displacement of the second conveying unit 100-2 along the rail 110 at the second speed.

In some embodiments, each vibration measurement includes parameters such as magnitude or frequency of the vibration. In some embodiments, the second vibration measurement is vibration experienced by the second gripping member 103-2, the second carrier 113-2 or the second semiconductor structure 111-2. In some embodiments, the second vibration measurement including several vibration measurements is collected and recorded by the second sensor 104-2. In some embodiments, the operation 409 is similar to the operation 403.

In some embodiments, the second vibration measurement is substantially less than or equal to the first vibration measurement. In some embodiments, the second vibration measurement is substantially less than or equal to the first vibration measurement and the predetermined vibration threshold. Since the second conveying unit 100-2 is displaced at the second speed which is derived based on the analysis of the first vibration measurement of the first conveying unit 100-1 (the operation 408), the vibration experienced by the second conveying unit 100-2 upon the displacement at the second speed shall be less than the vibration experienced by the first conveying unit 100-1 upon the displacement at the first speed.

In operation 410, the second vibration measurement is analyzed by the second unit controller 105-2. In some embodiments, the second vibration measurement is transmitted from the second sensor 104-2 to the second unit controller 105-2 for vibration analysis. In some embodiments, the second vibration measurement is wirelessly transmitted from the second sensor 104-2 to the second unit controller 105-2. In some embodiments, several results (such as a maximum or minimum among the second vibration measurement, a position of the rail where the maximum or minimum vibration occurred, etc.) are derived by the second unit controller 105-2 after the analysis of the second vibration measurement. In some embodiments, the operation 410 is similar to the operation 404.

In operation 411, a second signal based on the analysis of the second vibration measurement is transmitted from the second unit controller 105-2 to the central controller 106. In some embodiments, the second signal is generated based on the analysis of the second vibration measurement, and then transmitted to the central controller 106. In some embodiments, the second signal is wirelessly transmitted from the second unit controller 105-2 to the central controller 106. In some embodiments, the operation 411 is similar to the operation 405.

Figure 7:
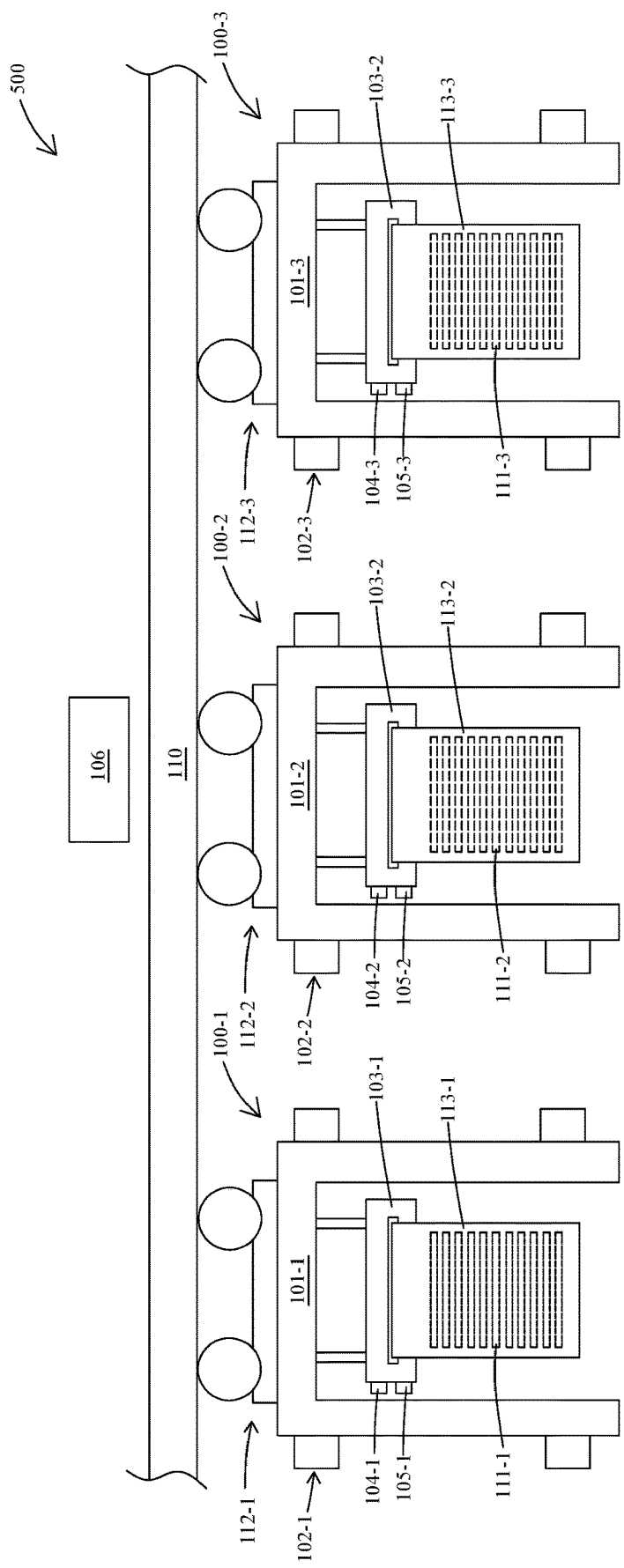
FIG. 7 is a schematic view of operating the second conveying system by a method of FIG. 6 in accordance with some embodiments of the present disclosure.

In operation 412, a third conveying unit 100-3 is provided as shown in FIG. 7. In some embodiments, the third conveying unit 100-3 is in configuration similar to the first conveying unit 100-1 and the second conveying unit 100-2 described above or shown in FIGS. 1, 2 and 5. In some embodiments, parameters associated with the third conveying unit 100-3 are different from parameters associated with the first conveying unit 100-1 or the second conveying unit 100-2. For example, a weight of the first conveying unit 100-1, a weight of the second conveying unit 100-2 and a weight of the third conveying unit are different from each other. In some embodiments, the first conveying unit 100-1, the second conveying unit 100-2 and the third conveying unit 100-3 are in same configuration. For example, a weight of the first conveying unit 100-1, a weight of the second conveying unit 100-2 and a weight of the third conveying unit are same as each other.

In some embodiments, the third conveying unit 100-3 is movably mounted on the rail 110. In some embodiments, the third conveying unit 100-3 includes a third housing 101-3, a third gripping member 103-3 disposed inside the third housing 101-3, a third sensor 104-3 disposed on the third gripping member 103-3, and a third unit controller 105-3 disposed on the third gripping member 103-3, which are in configurations similar to the first housing 101-1, the first gripping member 103-1, the first sensor 104-1 and the first unit controller 105-1 respectively described above or shown in FIGS. 1-2.

In operation 413, a second feedback signal based on the second signal is transmitted from the central controller 106 to the third unit controller 105-3. In some embodiments, the second feedback signal is generated based on the second signal from the second sensor 104-2, and then transmitted to the third unit controller 105-3 of the third conveying unit 100-3. In some embodiments, the second feedback signal is wirelessly transmitted from the central controller 106 to the third unit controller 105-3.

In some embodiments, the second signal is analyzed by the central controller 106, and then the second feedback signal is generated by the central controller 106 after the analysis. In some embodiments, the parameters associated with the third conveying unit 100-3 (such as a weight of the third semiconductor structures 111-3 in the third carrier 113-3, etc.) and a predetermined speed for the third conveying unit 100-3 travelling along the rail 110 are considered upon the analysis by the central controller 106. In some embodiments, the operation 413 is similar to the operation 407.

In operation 414, the third conveying unit 100-3 is displaced along the rail 110 at the second speed or a third speed based on the second feedback signal. In some embodiments, the third conveying unit 100-3 is moved laterally along the rail 110 at the second speed or the third speed.

In some embodiments, the third conveying unit 100-3 is displaced at the second speed. If the third conveying unit 100-3 is in same configuration as the second conveying unit 100-2 (such as the weight of the third conveying unit 100-3 is same as the weight of the second conveying unit 100-2, etc.) and the vibration experienced by the second conveying unit 100-2 upon the displacement at the second speed is minimized or is substantially less than the predetermined vibration threshold, the vibration experienced by the third conveying unit 100-3 upon the displacement at the second speed shall also be minimized or is substantially less than the predetermined vibration threshold.

In some embodiments, the third conveying unit 100-3 is displaced at the third speed if the third conveying unit 100-3 is in different configuration from the second conveying unit 100-2 (such as the weight of the third conveying unit 100-3 is different from the weight of the second conveying unit 100-2, etc.) or the second vibration measurement is substantially greater than the predetermined vibration threshold. In some embodiments, the third speed is substantially different from the second speed. In other words, the second conveying unit 100-2 and the third conveying unit 100-3 may travel at different speed along the same rail 110. In some embodiments, the third speed is derived based on the analysis of the second vibration measurement and the parameters associated with the third conveying unit 100-3, etc. In some embodiments, the third speed is derived by adjusting the second speed based on the analysis of the second vibration measurement and the parameters associated with the third conveying unit 100-3.

In some embodiments, the third speed is substantially less than the second speed if the second vibration measurement is substantially greater than a predetermined vibration threshold. For example, if the vibration experienced by the second conveying unit 100-2 is substantially greater than the predetermined vibration threshold, the third speed is derived by decreasing the second speed. In other words, the third conveying unit 100-3 is decelerated compared with the displacement of the second conveying unit 100-2.

In some embodiments, the third speed is substantially greater than the second speed if the second vibration measurement is substantially less than a predetermined vibration threshold. For example, if the vibration experienced by the second conveying unit 100-2 is substantially less than the predetermined vibration threshold, the third speed is derived by increasing the second speed. In other words, the third conveying unit 100-3 is accelerated compared with the displacement of the second conveying unit 100-2.

In some embodiments, after the third speed is derived, a third vibration measurement is obtained by the third sensor 104-3 of the third conveying unit 100-3 upon the displacement of the third conveying unit 100-3 along the rail 110 at the third speed. In some embodiments, the third vibration measurement is collected and recorded by the third sensor 104-3. In some embodiments, the vibration experienced by the third conveying unit 100-3 upon the displacement at the third speed shall also be minimized or is substantially less than the predetermined vibration threshold. In some embodiments, the third vibration measurement is substantially less than or equal to the second vibration measurement and the first vibration measurement.

Figure 8:
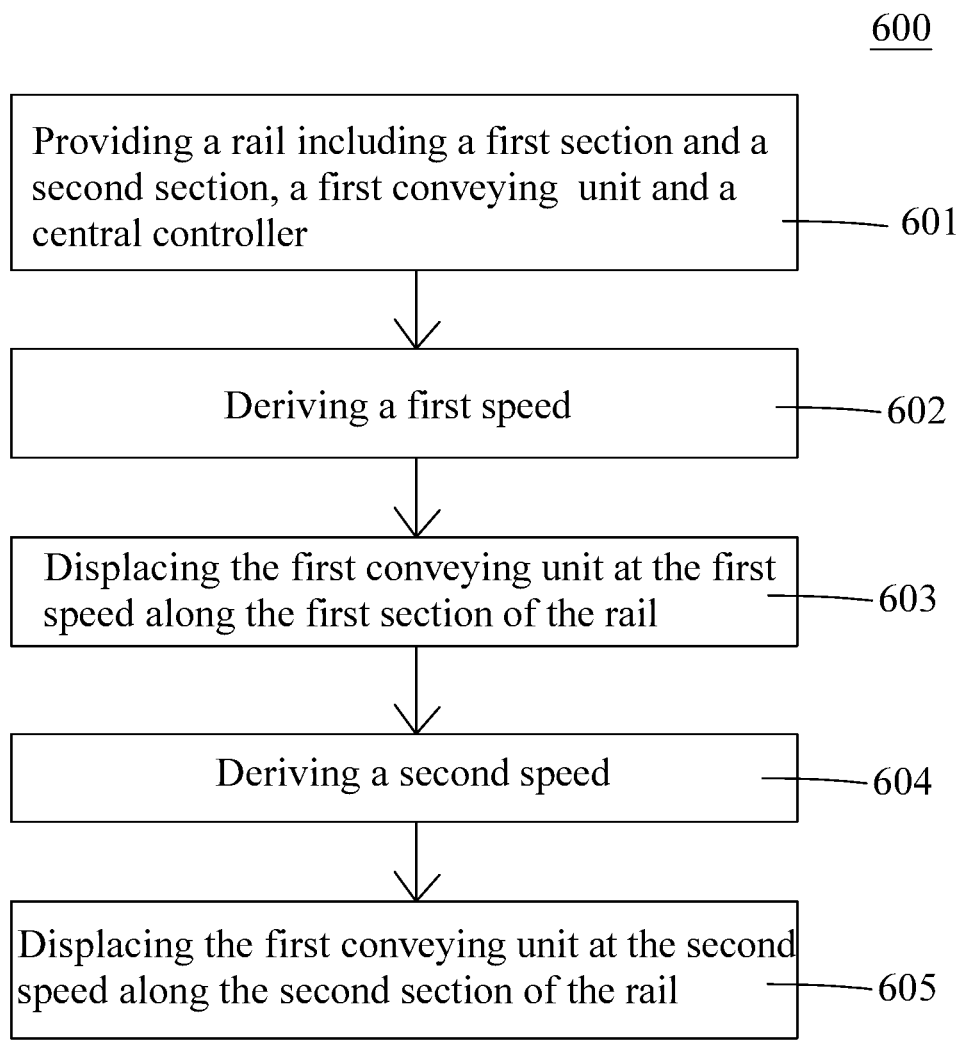
FIG. 8 is a flow diagram of a method of operating a third conveying system in accordance with some embodiments of the present disclosure.

In the present disclosure, another method of operating a conveying system is disclosed. A method 600 includes a number of operations and the description and illustration are not deemed as a limitation as the sequence of the operations. FIG. 8 is an embodiment of the method 600 of operating a third conveying system 700. The method 600 includes a number of operations (601, 602, 603, 604 and 605).

Figure 9:
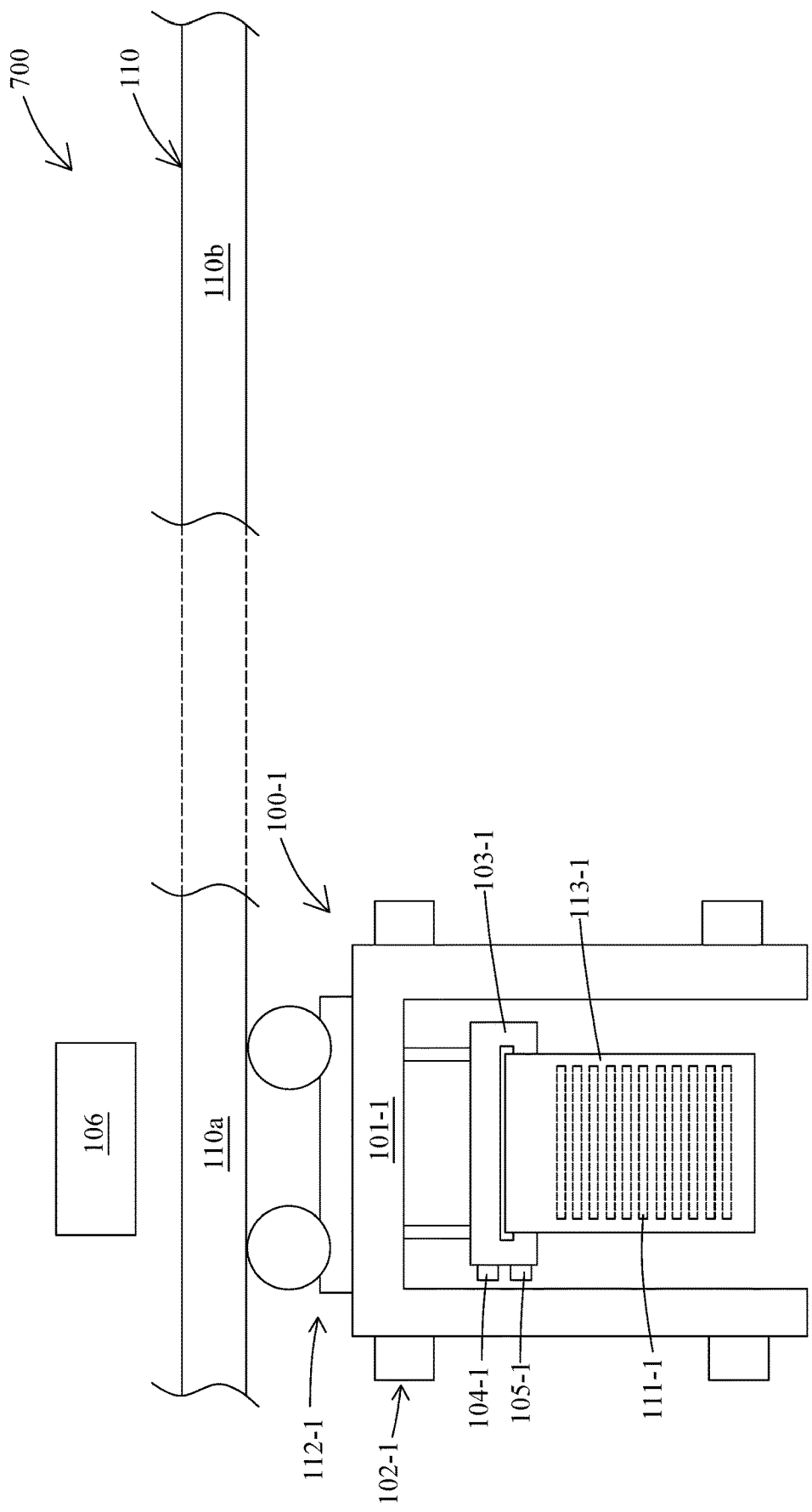
FIGS. 9-12 are schematic views of operating the third conveying system by a method of FIG. 8 in accordance with some embodiments of the present disclosure.

In operation 601, a rail 110, a first conveying unit 100-1 and a central controller 106 are provided as shown in FIG. 9. In some embodiments, the third conveying system 700 includes the rail 110 including a first section 110a and a second section 110b, the first conveying unit 100-1 movably mounted on the rail 110 and configured to displace along the first section 110a a first predetermined speed and along the second section 110b at a second predetermined speed, and the central controller 106 configured to control the first conveying unit 100-1.

In some embodiments, the first section 110a and the second section 110b of the rail 110 are in different configurations or shapes. In some embodiments, a top cross section of the first section 110a and a top cross section of the second section 110b are in different shapes. In some embodiments, the top cross section of the first section 110a and the top cross section of the second section 110b are respectively in a strip shape, U shape, N shape, Y shape, etc. In some embodiments, the first conveying unit 100-1 is configured to displace at different predetermined speeds along different sections of the rail 110.

In some embodiments, the first conveying unit 100-1 is in configuration as described above or shown in FIGS. 1-2. In some embodiments, the first conveying unit 100-1 is movably mounted on the rail 110. In some embodiments, the first conveying unit 100-1 includes a first housing 101-1, a first gripping member 103-1 disposed inside the first housing 101-1, a first sensor 104-1 disposed on the first gripping member 103-1, and a first unit controller 105-1 disposed on the first gripping member 103-1, which are in configurations as described above or shown in FIGS. 1-2.

In some embodiments, the central controller 106 is configured to receive a signal from the first unit controller 105-1 of the first conveying unit 100-1, transmit a feedback signal to the first unit controller 105-1, and control movement of the first conveying unit 100-1. In some embodiments, the central controller 106 is wirelessly communicable with the first unit controller 105-1.

In operation 602, a first speed is derived by the central controller based on several parameters associated with the first conveying unit 100-1. In some embodiments, the first speed is derived by the central controller 106 based on the first predetermined speed, the parameters associated with the first conveying unit 100-1 (such as a weight of the first semiconductor structures 111-1 in the first carrier 113-1, etc.), the shape of the first section 110a of the rail 110, vibration measurements obtained upon displacement of other previous conveying units along the first section 110a, etc. In some embodiments, the first predetermined speed is adjusted to the first speed. In some embodiments, the first speed is derived by increasing or decreasing the first predetermined speed.

In operation 603, the first conveying unit 100-1 is displaced along the first section 110a of the rail 110 at the first speed. The first conveying unit 100-1 is displaced at the first speed instead of the first predetermined speed. In some embodiments, a first vibration measurement is obtained by the first sensor 104-1 upon the displacement of the first conveying unit 100-1 along the first section 110a of the rail 110 at the first speed. In some embodiments, the first vibration measurement is substantially less than or equal to a predetermined vibration threshold. In some embodiments, the first vibration measurement is collected and recorded by the first sensor 104-1.

In operation 604, a second speed is derived by the central controller based on the parameters associated with the first conveying unit 100-1. In some embodiments, the second speed is derived by the central controller based on the second predetermined speed, the parameters associated with the first conveying unit 100-1, the shape of the second section 110b of the rail 110, vibration measurements obtained upon displacement of other previous conveying units along the second section 110b, etc. In some embodiments, the second predetermined speed is adjusted to the second speed. In some embodiments, the second speed is derived by increasing or decreasing the second predetermined speed.

Figure 10:
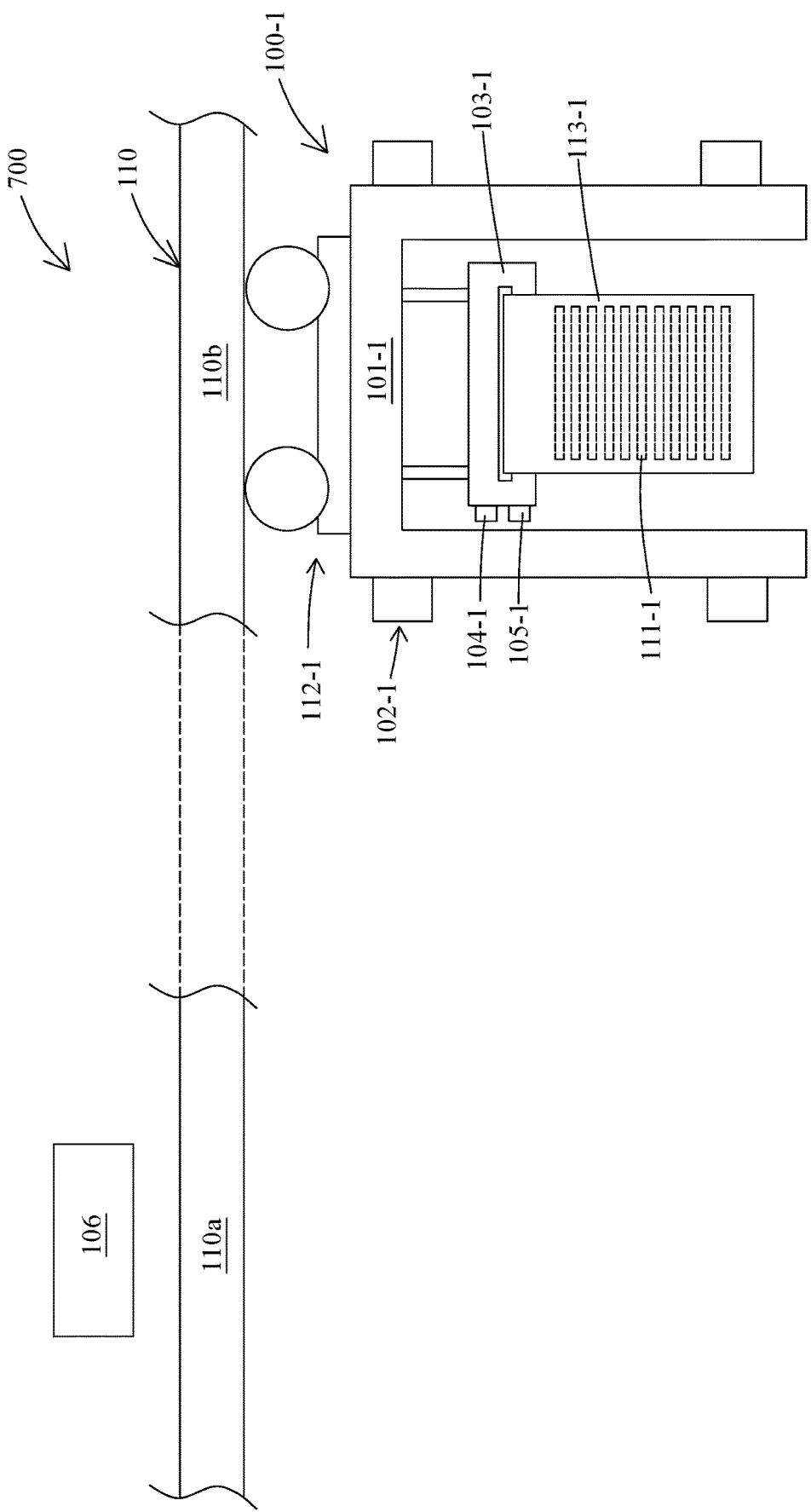

In operation 605, the first conveying unit 100-1 is displaced along the second section 110b of the rail 110 at the second speed as shown in FIG. 10. The first conveying unit 100-1 is displaced at the second speed instead of the second predetermined speed. In some embodiments, a second vibration measurement is obtained by the first sensor 104-1 upon the displacement of the first conveying unit 100-1 along the second section 110b of the rail 110 at the second speed. In some embodiments, the second vibration measurement is substantially less than or equal to the predetermined vibration threshold. In some embodiments, the second vibration measurement is collected and recorded by the first sensor 104-1.

Figure 11:
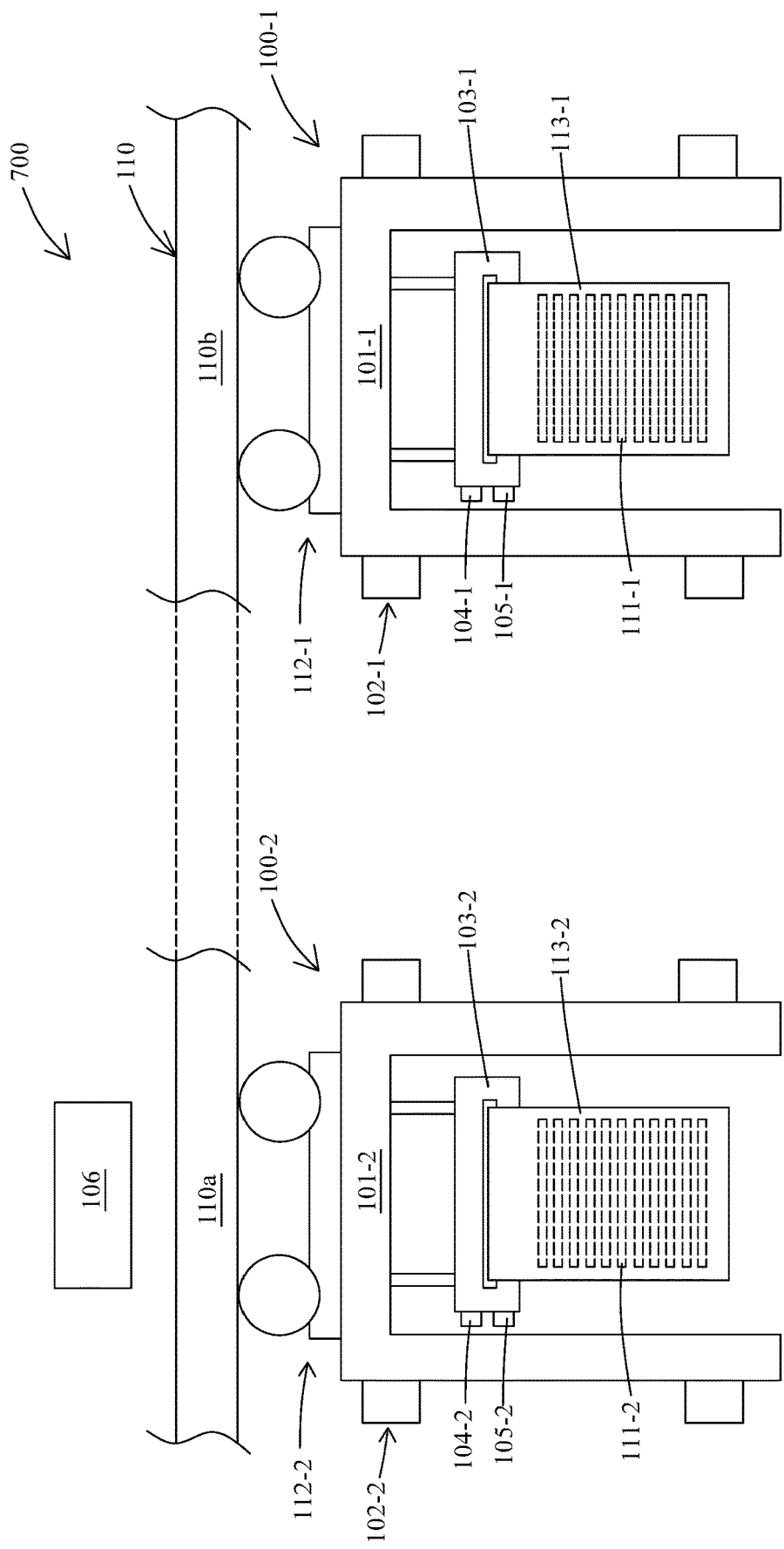

In some embodiments, a second conveying unit 100-2 is further provided as shown in FIG. 11. In some embodiments, the second conveying unit 100-2 is movably mounted on the rail 110 and configured to displace along the first section 110a at the first predetermined speed and along the second section 110b at the second predetermined speed. In some embodiments, the second conveying unit 100-2 is in configuration similar to the first conveying unit 100-1. In some embodiments, the central controller 106 is configured to control the second conveying unit 100-2.

In some embodiments, a third speed is derived by the central controller 106 based on several parameters associated with the second conveying unit 100-2. In some embodiments, the third speed is derived by the central controller based on the first predetermined speed, the parameters associated with the second conveying unit 100-2 (such as a weight of the second semiconductor structures 111-2 in the second carrier 113-2, etc.), the shape of the first section 110a of the rail 110, vibration measurements obtained upon displacement of other previous conveying units along the first section 110a, etc. In some embodiments, the first predetermined speed is adjusted to the third speed. In some embodiments, the third speed is substantially different from the first speed. In some embodiments, the third speed is derived by increasing or decreasing the first predetermined speed.

In some embodiments, the second conveying unit 100-2 is displaced along the first section 110a of the rail 110 at the third speed. The second conveying unit 100-2 is displaced at the third speed instead of the first predetermined speed. In some embodiments, a third vibration measurement is obtained by the second sensor 104-2 upon the displacement of the second conveying unit 100-2 along the first section 110a of the rail 110 at the third speed. In some embodiments, the third vibration measurement of the second conveying unit 100-2 is substantially less than or equal to the predetermined vibration threshold. In some embodiments, the third vibration measurement is collected and recorded by the second sensor 104-2.

In some embodiments, a fourth speed is derived by the central controller 106 based on several parameters associated with the second conveying unit 100-2. In some embodiments, the fourth speed is derived by the central controller based on the second predetermined speed, the parameters associated with the second conveying unit 100-2 (such as a weight of the second semiconductor structures 111-2 in the second carrier 113-2, etc.), the shape of the second section 110b of the rail 110, the second vibration measurement, vibration measurements obtained upon displacement of other previous conveying units along the second section 110b, etc. In some embodiments, the second predetermined speed is adjusted to the fourth speed. In some embodiments, the fourth speed is substantially different from the second speed. In some embodiments, the fourth speed is derived by increasing or decreasing the second predetermined speed.

Figure 12:
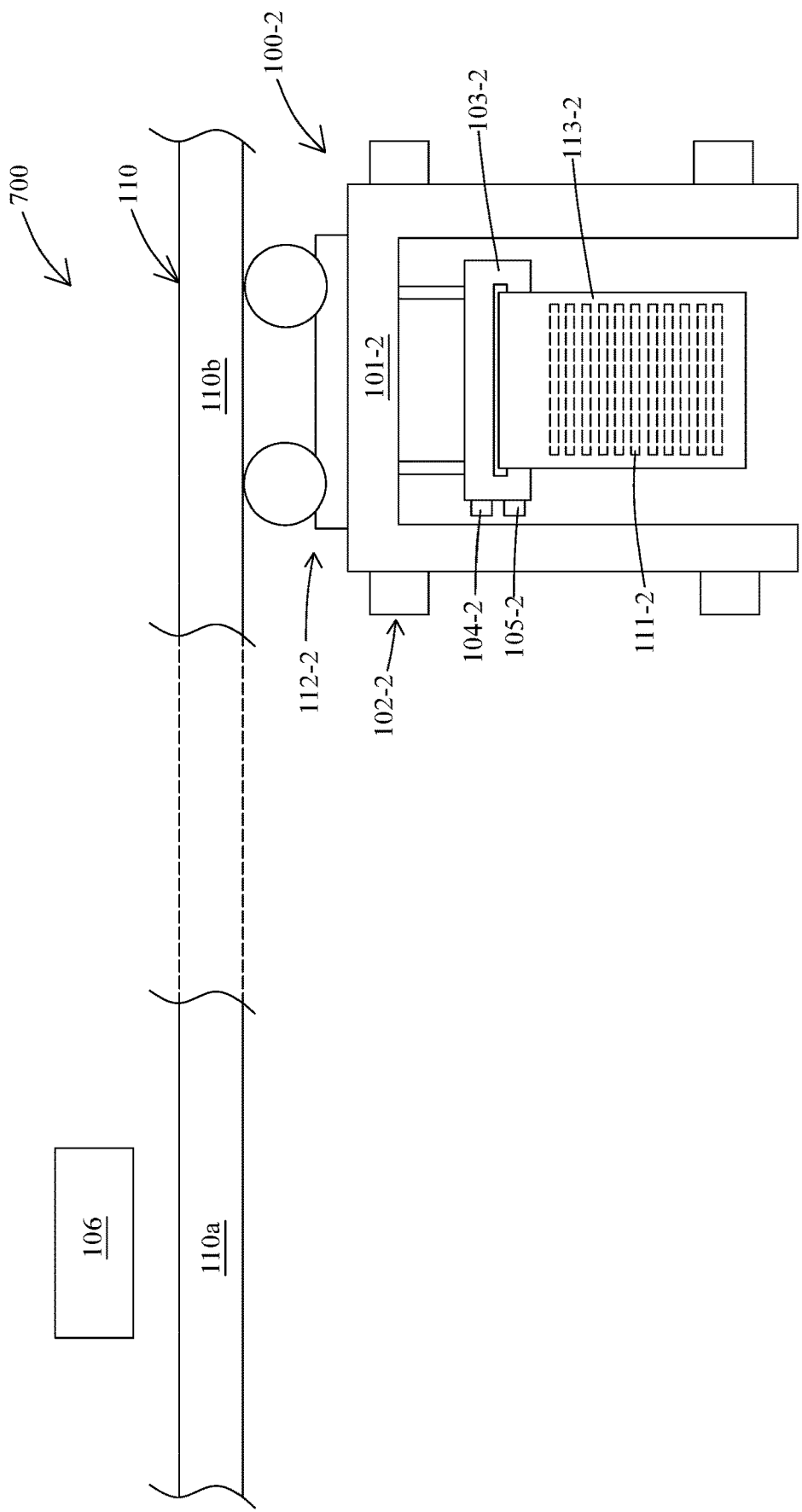

In some embodiments as shown in FIG. 12, the second conveying unit 100-2 is displaced along the second section 110b of the rail 110 at the fourth speed. The second conveying unit 100-2 is displaced at the fourth speed instead of the second predetermined speed. In some embodiments, a fourth vibration measurement is obtained by the second sensor 104-2 upon the displacement of the second conveying unit 100-2 along the second section 110b of the rail 110 at the fourth speed. In some embodiments, the fourth vibration measurement of the second conveying unit 100-2 is substantially less than or equal to the predetermined vibration threshold. In some embodiments, the fourth vibration measurement is collected and recorded by the second sensor 104-2.

In the present disclosure, a method is disclosed. The method includes providing a rail, a first conveying unit movably mounted on the rail, and a central controller configured to control the first conveying unit, wherein the first conveying unit includes a first housing, a first gripping member disposed inside the first housing, a first sensor disposed on the first gripping member, and a first unit controller disposed on the first gripping member; displacing the first conveying unit along the rail at a first speed; obtaining a first vibration measurement by the first sensor upon the displacement of the first conveying unit along the rail at the first speed; analyzing the first vibration measurement by the first unit controller; transmitting a first signal based on the analysis of the first vibration measurement from the first unit controller to the central controller; providing a second conveying unit movably mounted on the rail, wherein the second conveying unit includes a second housing, a second gripping member disposed inside the second housing, a second sensor disposed on the second gripping member and a second unit controller disposed on the second gripping member; transmitting a first feedback signal based on the first signal from the central controller to the second unit controller; and displacing the second conveying unit along the rail at a second speed based on the first feedback signal.

In some embodiments, the first vibration measurement is substantially greater than a predetermined vibration threshold, and the second speed is substantially less than the first speed. In some embodiments, the first vibration measurement is substantially less than a predetermined vibration threshold, and the second speed is substantially greater than the first speed. In some embodiments, the first signal is wirelessly transmitted from the first unit controller to the central controller, and the first feedback signal is wirelessly transmitted from the central controller to the second unit controller.

In some embodiments, the method further includes obtaining a second vibration measurement by the second sensor upon the displacement of the second conveying unit along the rail at the second speed, wherein the second vibration measurement is substantially less than or equal to the first vibration measurement. In some embodiments, the method further includes providing a third conveying unit movably mounted on the rail, wherein the third conveying unit includes a third housing, a third gripping member disposed inside the third housing, a third sensor disposed on the third gripping member and a third unit controller disposed on the third gripping member; and displacing the third conveying unit along the rail at the second speed. In some embodiments, the second conveying unit and the third conveying unit are in same configurations.

In some embodiments, the method further includes obtaining a second vibration measurement by the second sensor upon the displacement of the second conveying unit along the rail at the second speed; providing a third conveying unit movably mounted on the rail, wherein the third conveying unit includes a third housing, a third gripping member disposed inside the third housing, a third sensor disposed on the third gripping member and a third unit controller disposed on the third gripping member; transmitting a second signal based on the analysis of the second vibration measurement from the second unit controller to the central controller; transmitting a second feedback signal based on the second signal from the central controller to the third unit controller; and displacing the third conveying unit along the rail at a third speed based on the second feedback signal.

In some embodiments, the second vibration measurement is substantially greater than a predetermined vibration threshold, and the third speed is substantially less than the second speed. In some embodiments, the second vibration measurement is substantially less than a predetermined vibration threshold, and the third speed is substantially greater than the second speed. In some embodiments, the method further includes obtaining a third vibration measurement by the third sensor upon the displacement of the third conveying unit along the rail at the third speed, wherein the third vibration measurement is substantially less than or equal to the second vibration measurement and the first vibration measurement.

In some embodiments, the method includes providing a rail including a first section and a second section, a first conveying unit movably mounted on the rail and configured to displace along the first section at a first predetermined speed and along the second section at a second predetermined speed, and a central controller configured to control the first conveying unit; deriving a first speed by the central controller based on a plurality of parameters associated with the first conveying unit; displacing the first conveying unit along the first section of the rail at the first speed; deriving a second speed by the central controller based on the plurality of parameters associated with the first conveying unit; and displacing the first conveying unit along the second section of the rail at the second speed, wherein the first speed is derived by increasing or decreasing the first predetermined speed, and the second speed is derived by increasing or decreasing the second predetermined speed.

In some embodiments, a top cross section of the first section and a top cross section of the second section have different shapes. In some embodiments, the method further includes providing a second conveying unit movably mounted on the rail and configured to displace along the first section at the first predetermined speed; deriving a third speed by the central controller based on a plurality of second parameters associated with the second conveying unit; and displacing the second conveying unit along the first section of the rail at the third speed; wherein the third speed is derived by increasing or decreasing the first predetermined speed and is substantially different from the first speed.

In some embodiments, the method further includes obtaining a first vibration measurement of the first conveying unit upon the displacement of the first conveying unit along the first section of the rail at the first speed; obtaining a second vibration measurement of the second conveying unit upon the displacement of the second conveying unit along the first section of the rail at the third speed; wherein the first vibration measurement and the second vibration measurement are substantially less than or equal to a predetermined vibration threshold.

In the present disclosure, a conveying unit is disclosed. The conveying unit includes a housing; a collision prevention mechanism disposed on a sidewall of the housing; a gripping member configured to hold a carrier for carrying a semiconductor structure; a sensor disposed on the gripping member and configured to measure and collect data associated with vibration of the gripping member; and an unit controller disposed on the gripping member and configured to analyze the data from the sensor and control a movement of the conveying unit.

In some embodiments, the gripping member is moveable into and out of the housing. In some embodiments, the sensor is a vibration meter. In some embodiments, the sensor and the unit controller are disposed inside the housing. In some embodiments, the housing is movably mountable on an overhead rail configured to convey the conveying unit along the overhead rail.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
providing a rail, a first conveying unit movably mounted on the rail, and a central controller configured to control the first conveying unit, wherein the first conveying unit includes a first housing, a first gripping member disposed inside the first housing, a first sensor disposed on the first gripping member, and a first unit controller disposed on the first gripping member;
displacing the first conveying unit along the rail at a first speed;
obtaining a first vibration measurement by the first sensor upon the displacement of the first conveying unit along the rail at the first speed;
analyzing the first vibration measurement by the first unit controller;
transmitting a first signal based on the analysis of the first vibration measurement from the first unit controller to the central controller;
providing a second conveying unit movably mounted on the rail, wherein the second conveying unit includes a second housing, a second gripping member disposed inside the second housing, a second sensor disposed on the second gripping member and a second unit controller disposed on the second gripping member;
transmitting a first feedback signal based on the first signal from the central controller to the second unit controller; and
displacing the second conveying unit along the rail at a second speed based on the first feedback signal,
wherein when the first vibration measurement is greater than a predetermined vibration threshold, the second speed is less than the first speed, and when the first vibration measurement is less than a predetermined vibration threshold, the second speed is greater than the first speed.

2. The method of claim 1, wherein the first vibration measurement includes magnitudes and frequencies of a vibration of the first gripping member.

3. The method of claim 1, wherein the parameters associated with the first conveying unit are different from parameters associated with the second conveying unit.

4. The method of claim 1, wherein the first signal is wirelessly transmitted from the first unit controller to the central controller, and the first feedback signal is wirelessly transmitted from the central controller to the second unit controller.

5. The method of claim 1, further comprising obtaining a second vibration measurement by the second sensor upon the displacement of the second conveying unit along the rail at the second speed, wherein the second vibration measurement is substantially less than or equal to the first vibration measurement.

6. The method of claim 1, further comprising:
providing a third conveying unit movably mounted on the rail, wherein the third conveying unit includes a third housing, a third gripping member disposed inside the third housing, a third sensor disposed on the third gripping member and a third unit controller disposed on the third gripping member; and
displacing the third conveying unit along the rail at the second speed.

7. The method of claim 6, wherein the second conveying unit and the third conveying unit are in same configurations.

8. The method of claim 1, further comprising:
obtaining a second vibration measurement by the second sensor upon the displacement of the second conveying unit along the rail at the second speed;
providing a third conveying unit movably mounted on the rail, wherein the third conveying unit includes a third housing, a third gripping member disposed inside the third housing, a third sensor disposed on the third gripping member and a third unit controller disposed on the third gripping member;
transmitting a second signal based on the analysis of the second vibration measurement from the second unit controller to the central controller;
transmitting a second feedback signal based on the second signal from the central controller to the third unit controller; and
displacing the third conveying unit along the rail at a third speed based on the second feedback signal.

9. The method of claim 8, wherein the second vibration measurement is greater than a predetermined vibration threshold, and the third speed is less than the second speed.

10. The method of claim 8, wherein the second vibration measurement is less than a predetermined vibration threshold, and the third speed is greater than the second speed.

11. The method of claim 8, further comprising obtaining a third vibration measurement by the third sensor upon the displacement of the third conveying unit along the rail at the third speed, wherein the third vibration measurement is substantially less than or equal to the second vibration measurement and the first vibration measurement.

12. A method, comprising:
providing a rail including a first section and a second section, a first conveying unit movably mounted on the rail and configured to displace along the first section at a first predetermined speed and along the second section at a second predetermined speed, and a central controller configured to control the first conveying unit;
deriving a first speed by increasing or decreasing the first predetermined speed based on a plurality of parameters associated with the first conveying unit and the first section of the rail;
displacing the first conveying unit along the first section of the rail at the first speed;
obtaining a first vibration measurement of the first conveying unit upon the displacement of the first conveying unit along the first section of the rail at the first speed;
deriving a second speed by increasing or decreasing the second predetermined speed based on the plurality of parameters associated with the first conveying unit; and
displacing the first conveying unit along the second section of the rail at the second speed;
obtaining a second vibration measurement of the first conveying unit upon the displacement of the first conveying unit along the second section of the rail at the second speed,
wherein the first vibration measurement and the second vibration measurement are substantially less than or equal to a predetermined vibration threshold.

13. The method of claim 12, wherein a top cross section of the first section and a top cross section of the second section have different shapes.

14. The method of claim 12, further comprising:
providing a second conveying unit movably mounted on the rail and configured to displace along the first section at the first predetermined speed;
deriving a third speed by the central controller based on a plurality of second parameters associated with the second conveying unit; and
displacing the second conveying unit along the first section of the rail at the third speed;
wherein the third speed is derived by increasing or decreasing the first predetermined speed and is substantially different from the first speed.

15. The method of claim 14, further comprising:
obtaining a third vibration measurement of the second conveying unit upon the displacement of the second conveying unit along the first section of the rail at the third speed;
wherein the third vibration measurement is substantially less than or equal to the predetermined vibration threshold.

* * * * *